(12) United States Patent
Chang et al.

(10) Patent No.: US 7,986,395 B2
(45) Date of Patent: *Jul. 26, 2011

(54) IMMERSION LITHOGRAPHY APPARATUS AND METHODS

(75) Inventors: Ching-Yu Chang, Yilang County (TW); Burn Jeng Lin, Hsin-Chu (TW); Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 140 days.

This patent is subject to a terminal disclaimer.

(21) Appl. No.: 11/427,421

(22) Filed: Jun. 29, 2006

(65) Prior Publication Data

US 2007/0091287 A1 Apr. 26, 2007

Related U.S. Application Data

(60) Provisional application No. 60/729,565, filed on Oct. 24, 2005.

(51) Int. Cl.
*G03B 27/42* (2006.01)
(52) U.S. Cl. ............................................ 355/53; 355/30
(58) Field of Classification Search ................ 355/53, 355/30
See application file for complete search history.

(56) References Cited

U.S. PATENT DOCUMENTS

| | | | |
|---|---|---|---|
| 4,480,910 A | 11/1984 | Takanashi et al. | |
| 4,509,852 A | 4/1985 | Tabarelli et al. | |
| 5,132,560 A | 7/1992 | Kane | |
| 5,134,632 A | 7/1992 | Fletcher et al. | |
| 5,457,489 A | 10/1995 | Yamamoto et al. | |
| 6,169,765 B1 | 1/2001 | Holcombe | |
| 6,232,796 B1 | 5/2001 | Batra et al. | |
| 6,496,257 B1 | 12/2002 | Taniguchi et al. | |
| 6,724,460 B2 | 4/2004 | Van Schaik et al. | |
| 6,781,670 B2 | 8/2004 | Krautschik | |
| 6,781,685 B2 | 8/2004 | Hamm | |
| 6,784,972 B2 | 8/2004 | Nagahashi et al. | |
| 6,788,477 B2 | 9/2004 | Lin | |
| 6,809,794 B1 | 10/2004 | Sewell | |
| 6,828,569 B2 | 12/2004 | Van Schaik et al. | |

(Continued)

FOREIGN PATENT DOCUMENTS

EP 1486827 A2 12/2004

(Continued)

OTHER PUBLICATIONS

Japanese Office Action issued by Japanese Patent Office mailed Mar. 26, 2009, 4 pages, Japanese Application No. 2006-287405.
Written Opinion issued by Australian Patent Office mailed May 6, 2009, 5 pages, SG Application No. 200605034-8.
Office Action issued in related U.S. Appl. No. 11/697,469, filed Apr. 6, 2007, mailed on Jun. 4, 2009, 12 pages.

(Continued)

*Primary Examiner* — Edward J Glick
*Assistant Examiner* — Mesfin T Asfaw
(74) *Attorney, Agent, or Firm* — Haynes and Boone, LLP

(57) ABSTRACT

A lithography apparatus includes an imaging lens module; a substrate table positioned underlying the imaging lens module and configured to hold a substrate; and a cleaning module adapted to clean the lithography apparatus. The cleaning module is selected from the group consisting of an ultrasonic unit, a scrubber, a fluid jet, an electrostatic cleaner, and combinations thereof.

20 Claims, 15 Drawing Sheets

U.S. PATENT DOCUMENTS

| | | |
|---|---|---|
| 7,119,035 B2 | 10/2006 | Ho et al. |
| 7,317,504 B2 | 1/2008 | DeSmit et al. |
| 7,370,659 B2 * | 5/2008 | Hickman et al. ........... 134/115 R |
| 7,385,670 B2 * | 6/2008 | Compen et al. ................. 355/30 |
| 2004/0118184 A1 | 6/2004 | Violette |
| 2004/0147204 A1 * | 7/2004 | Sakai ................................ 451/2 |
| 2005/0028314 A1 * | 2/2005 | Hickman et al. ................ 15/302 |
| 2005/0051739 A1 | 3/2005 | Van Der Net et al. |
| 2005/0078286 A1 | 4/2005 | Dierichs et al. |
| 2005/0106512 A1 | 5/2005 | Endo et al. |
| 2005/0225734 A1 | 10/2005 | De Smit et al. |
| 2006/0023185 A1 * | 2/2006 | Hazelton et al. ................ 355/53 |
| 2006/0033898 A1 | 2/2006 | Cadee et al. |
| 2006/0050351 A1 * | 3/2006 | Higashiki ..................... 359/228 |
| 2006/0102277 A1 | 5/2006 | Maria Zaal et al. |
| 2006/0132731 A1 * | 6/2006 | Jansen et al. ................... 355/30 |
| 2006/0154188 A1 | 7/2006 | Hirayama et al. |
| 2006/0250588 A1 * | 11/2006 | Brandl ............................ 355/30 |
| 2006/0250591 A1 | 11/2006 | Straaijer |
| 2007/0004234 A1 | 1/2007 | Goodwin et al. |

FOREIGN PATENT DOCUMENTS

| | | |
|---|---|---|
| EP | 1562080 A1 | 8/2005 |
| JP | 2005-072404 | 3/2005 |
| WO | WO 2004/093130 A3 | 10/2004 |
| WO | WO 2004/105107 A1 | 12/2004 |

OTHER PUBLICATIONS

Final Office Action issued in related U.S. Appl. No. 11/697,469, filed Apr. 6, 2007, mailed on Dec. 30, 2009, 12 pages.

Ching-Yu Chang, Burn Jeng Lin and Chin-Hsiang Lin; "Immersion Lithography Apparatus And Methods;" U.S. Appl. No. 60/729,565, filed Oct. 24, 2005; 38 Pages.

Ching-Yu Chang and Burn Jeng Lin; "Apparatus And Method For Immersion Lithography;" U.S. Appl. No. 11/697,469, filed Apr. 6, 2007; 36 Pages.

Lin, Burn J., "Semiconductor Foundry, Lithography, and Partners," Proc. SPIE (The International Society for Optical Engineering), vol. 2688, Jul. 2002, pp. 11-24.

Owa, Solchi, et al., "Immersion Lithography; Its Potential Performance and Issues," Proc. SPIE(The International Society for Optical Engineering), vol. 5040, Jun. 2003, pp. 724-733.

Switkes, M., et al., "Immersion Lithography at 157 nm," Journal of Vacuum Science & Technology B: Microelectronics and nanometer Structures, vol. 19, Issue 6, Nov. 2001, pp. 2353-2356.

* cited by examiner

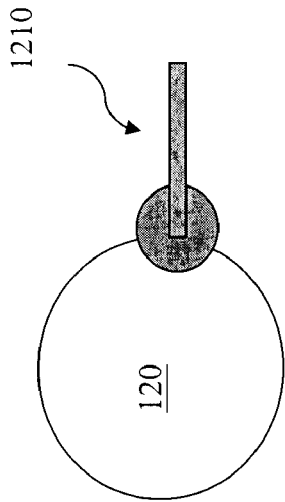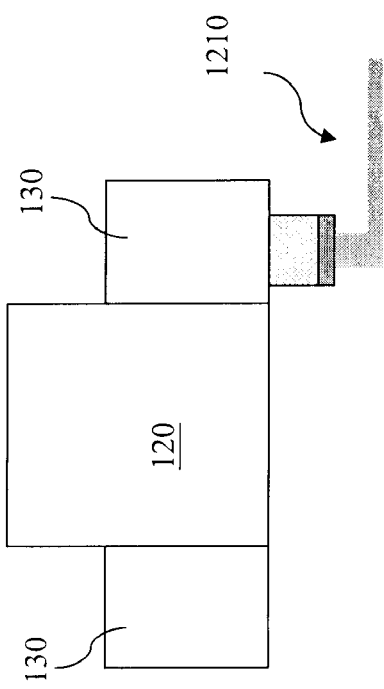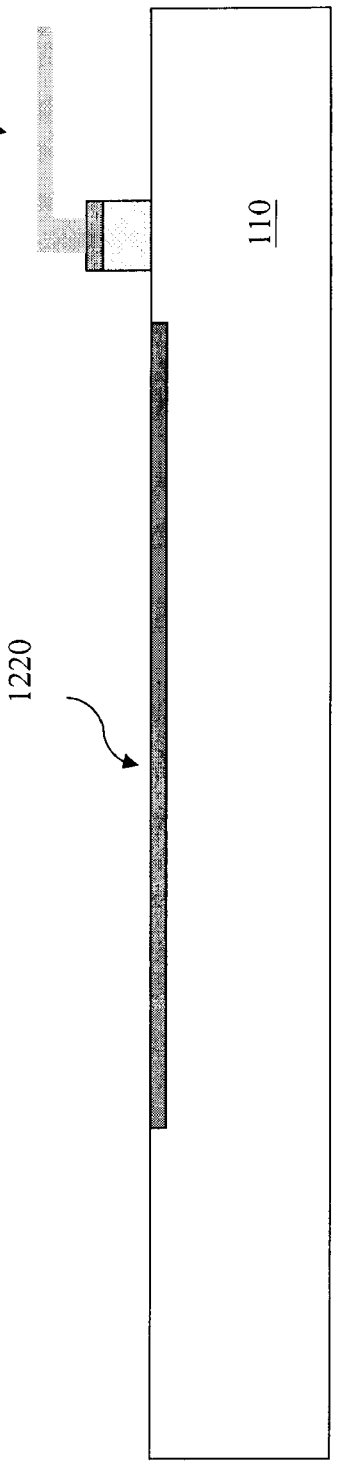
Fig. 12b
Fig. 12a
Fig. 12c

IMMERSION LITHOGRAPHY APPARATUS AND METHODS

CROSS REFERENCES

This patent claims the benefit of U.S. Ser. No. 60/729,565 filed Oct. 24, 2005, the contents of which are hereby incorporated by reference.

The present disclosure is related to the following commonly-assigned U.S. patent applications, the entire disclosures of which are hereby incorporated herein by reference:

(1) U.S. patent application Ser. No. 10/910,480 filed Aug. 3, 2004 and entitled "MEGASONIC IMMERSION LITHOGRAPHY EXPOSURE APPARATUS AND METHOD," having the same inventor and same assignee as the present invention;

(2) U.S. patent application Ser. No. 11/251,330 filed Oct. 14, 2005 and entitled "EXPOSURE METHOD AND APPARATUS FOR IMMERSION LITHOGRAPHY," having the same inventor and same assignee as the present invention; and (3) U.S. patent application Ser. No. 11/225,268 filed Sep. 13, 2005 and entitled "APPARATUS AND METHOD FOR IMMERSION LITHOGRAPHY," having the same inventor and same assignee as the present invention.

BACKGROUND

As semiconductor fabrication technologies are continually progressing to smaller feature sizes such as 65 nanometers, 45 nanometers, and below, immersion lithography methods are being adopted. However, during an exposure process using an immersion lithography system, contaminations such as particles and water residues can be introduced into the immersion lithography system and further contaminate semiconductor wafers to be processed therein. Such contamination can cause defects and yield degradations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12a through 12c illustrate schematic views of various embodiments of utilizing one of the cleaning modules of FIG. 1 through FIG. 11, to clean various components of an immersion lithography system

DETAILED DESCRIPTION

Figure 1:
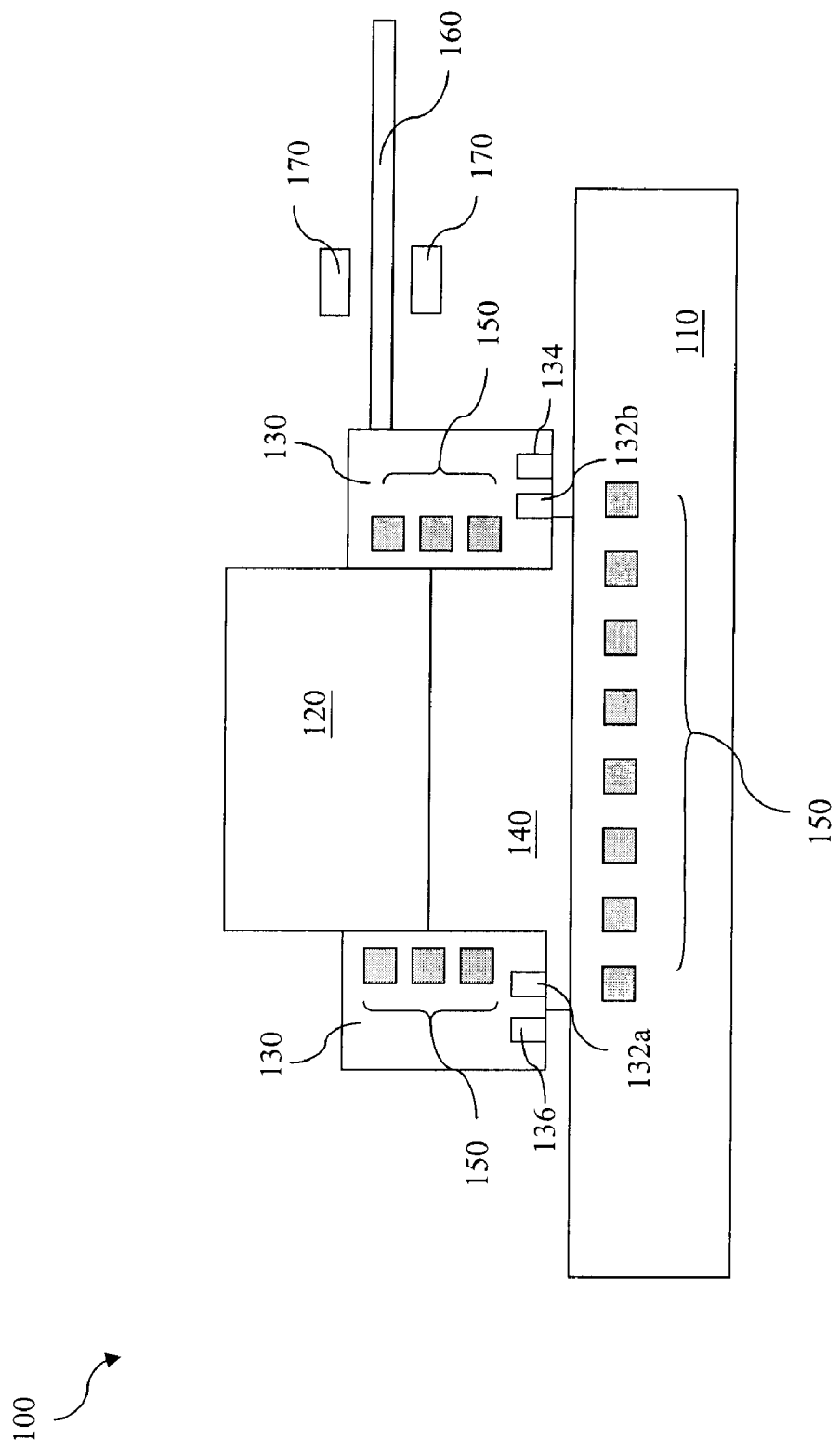
FIGS. 1 through 5 illustrate schematic views of various embodiments of an immersion lithography system having a cleaning module.

It is understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a schematic view of an embodiment of an immersion lithography system 100. The system 100 includes a substrate table 110 to hold a substrate to be processed by the system 100 for patterning. The substrate table 110 can be a substrate stage or include a substrate stage as a part thereof. The substrate table 110 is operable to secure and move a substrate relative to the system 100. For example, the substrate table 110 may be designed to be capable of translational and/or rotational displacement for substrate alignment, stepping, and scanning. The substrate table 110 may include various components suitable to perform precise movement.

A substrate to be held by the substrate table 110 and processed by the system 100 may be a semiconductor wafer such as a silicon wafer. Alternatively, the semiconductor wafer may include an elementary semiconductor, a compound semiconductor, an alloy semiconductor, or combinations thereof. The semiconductor wafer may include one or more material layers such as poly-silicon, metal, and/or dielectric, to be patterned. The substrate may further include an imaging layer formed thereon. The imaging layer can be a photoresist layer (resist layer, photo sensitive layer, patterning layer) that is responsive to an exposure process for creating patterns. The imaging layer may be a positive or negative type resist material and may have a multi-layer structure. One exemplary resist material is chemical amplifier (CA) resist.

The immersion lithography system 100 includes one or more imaging lens systems (referred to as a "lens system") 120. A semiconductor wafer may be positioned on a substrate table 110 under the lens system 120. The lens system 120 may further include or be integral to an illumination system (e.g., a condenser) which may have a single lens or multiple lenses and/or other lens components. For example, the illumination system may include microlens arrays, shadow masks, and/or other structures. The lens system 120 may further include an objective lens which may have a single lens element or a plurality of lens elements. Each lens element may include a transparent substrate and may further include a plurality of coating layers. The transparent substrate may be a conventional objective lens, and may be made of fused silica ($SiO_2$), calcium-fluoride ($CaF_2$), lithium fluoride (LiF), barium fluoride ($BaF_2$), or other suitable material. The materials used for each lens element may be chosen based on the wavelength of light used in the lithography process to minimize absorption and scattering.

The system 100 includes an immersion fluid retaining module 130 for holding a fluid 140 such as an immersion fluid or a cleaning fluid. The immersion fluid retaining module 130 may be positioned proximate (such as around) the lens system 120 and designed for other functions, in addition to holding the immersion fluid. The immersion fluid retaining module 130 and the lens system 120 make up (at least in part) an immersion head. The immersion fluid may include water (water solution or de-ionized water-DIW), high n fluid (n is index of refraction, the n value at 193 nm wavelength here is larger than 1.44), gas, or other suitable fluid. The cleaning fluid may include DIW, gas, or other normal cleaning solutions such as SC-1, SC-2, or Piranha known in the art. The various cleaning fluid may include, but are not limited to, ionic surfactant, non ionic surfactant, solvent, NH4OH, H2O2, O3, PGME/PGMEA (propylene glycol monomethyl ether/Propylene glycol monomethyl ether acetate), cyclohexanol, Isopropyl alcohol (IPA), acetone, alcohol, monoethanolamine (MEA) and combinations thereof. The gas may include, but are not limited to, O3, plasma gas and UV stimulate gas. The plasma and UV stimulate gas is selected may include, but are not limited to, O2, N2, Ar or air.

The immersion fluid retaining module 130 may include various apertures (or nozzles) for providing an immersion fluid for an exposure process, providing a cleaning fluid for cleaning, providing purge air for drying, removing any purged fluid, and/or performing other proper functions. Particularly, the module 130 may include an aperture 132a as an immersion fluid inlet to provide and transfer the immersion fluid into a space between the lens system 120 and the substrate on the substrate table 110. Collectively, the aperture 132a and/or an additional an aperture 132b may provide a cleaning fluid or cleaning gas for cleaning. The cleaning fluid may alternatively be provided through an additional cleaning fluid aperture. The module 130 may include an aperture 134 as an outlet to remove the immersion fluid, the cleaning fluid, or any other fluid to be purged. The module 130 may include an aperture 136 to provide a dry gas for purging any fluid residues and drying the surfaces cleaned. Such a cleaning process may have a duration ranging between about 0.1 second and 30 minutes.

The system 100 includes one ultrasonic unit or multiple ultrasonic units 150 operable to introduce ultrasonic energy to the cleaning fluid filled in the space between the substrate table 110 and the lens system 120. The ultrasonic units 150 are configured to incorporated in the immersion fluid retaining module 130 and/or the substrate table 110. The ultrasonic units 150 may be alternatively integrated with other components of the system 100. The ultrasonic units 150 are configured to provide ultrasonic energy for efficient cleaning. For example, the ultrasonic units 150 may be embedded in the substrate table 110 and/or the immersion fluid retaining module 130 and positioned proximate or adjacent the space filled with the cleaning fluid such that the ultrasonic power are substantially transported to the cleaning fluid. The ultrasonic units 150 may include ultrasonic generators that convert electrical energy to ultrasonic energy through piezoelectric elements know in the art. The ultrasonic units 150 may include piezoelectric materials such as quartz crystals, barium titanate, ceramic piezoelectric materials, and other suitable materials. The ultrasonic units 150 may be designed to be operable to produce ultrasonic energy at a frequency ranging between about 1 KHz and 1 GHz. The ultrasonic units 150 are able to deliver an ultrasonic power to the cleaning fluid effective for cleaning. The delivered ultrasonic power may range between about 1 milliwatt to 1 kilowatt. The ultrasonic power and frequency may be tunable according to a given recipe. Each ultrasonic unit may be individually tuned and generated for various cleaning requirements and performances.

The system 100 also includes a cleaning fluid supplier 160 to provide the cleaning fluid from a cleaning fluid source. The cleaning fluid supplier 160 may be integrated with the immersion fluid retaining module 130. The system 100 may also include a heater 170 positioned proximate the cleaning fluid supplier 160 designed and configured to heat the cleaning fluid to a higher temperature according to the given recipe. For example, the cleaning fluid may be heated to a temperature ranging between about 25° C. and 125° C. In a particular example, the cleaning fluid may be heated to a temperature about 40° C. The heater 170 may utilize any suitable technology such as infrared heating, microwave heating, and inductive coil. Alternatively, the cleaning fluid may be heated at a source outside of the system 100 and introduced into the system.

The immersion lithography system 100 may further include a radiation source. The radiation source may be a suitable ultraviolet (UV) or extra UV (EUV) light source. For example, the radiation source may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride (F2) excimer laser with a wavelength of 157 nm; or other light sources having a desired wavelength (e.g., below approximately 100 nm).

A photomask (also referred to as a mask or a reticle) may be introduced into the system 100 during an immersion lithography process. The mask may include a transparent substrate and a patterned absorption layer. The transparent substrate may use fused silica (SiO2) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN.

The system 100 described above can be used to perform a cleaning process in addition to an exposure process. The immersion lithography system 100 integrated with the ultrasonic units 150 and cleaning features described above can provide an efficient cleaning function to various components of the system 100 including the substrate table 110, the lens system 120, and the immersion fluid retaining module 130. Alternatively, system 100 can also be used for a dry photolithography patterning process and the module 130 may be designed differently only for dedicated cleaning function.

Figure 2:
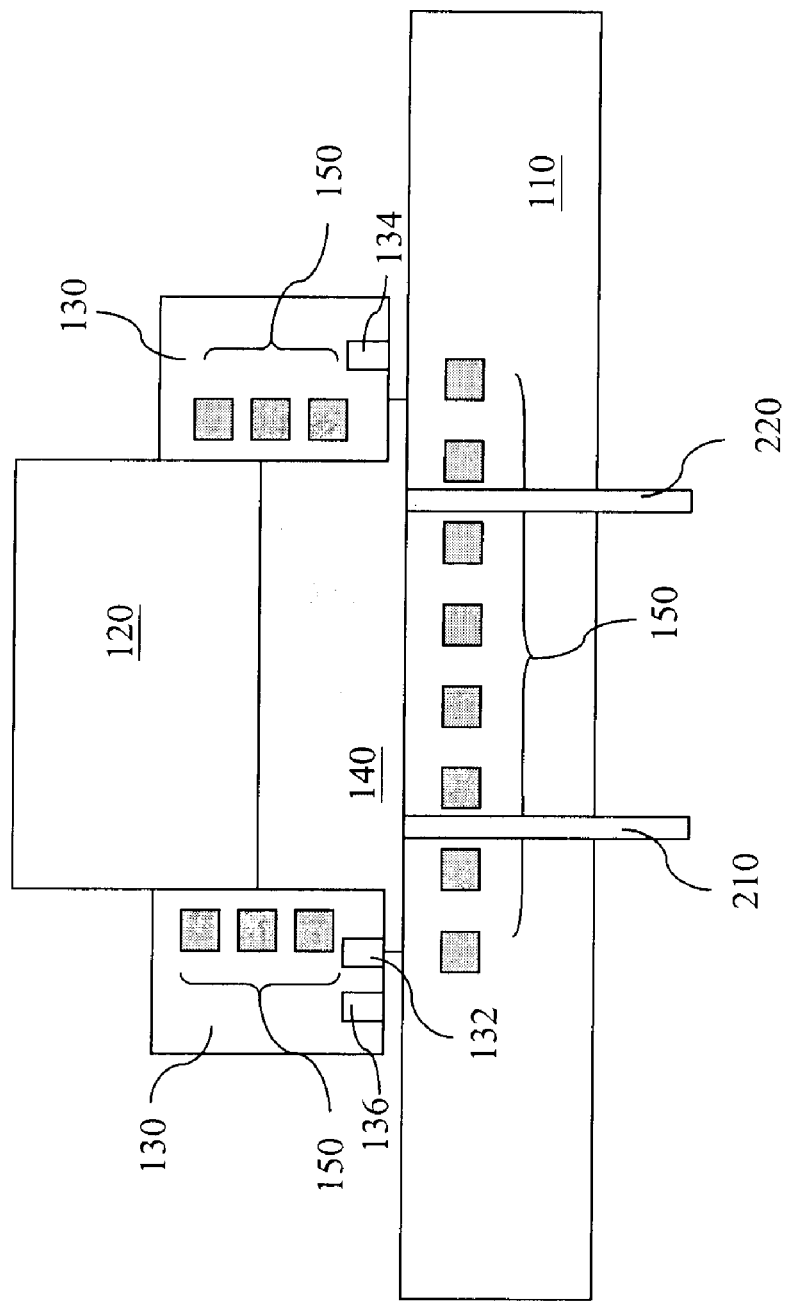

FIG. 2 illustrates a schematic view of another embodiment of an immersion lithography system 200. The system 200 may be substantially similar to the system 100 of FIG. 1 except that a cleaning fluid supplier 210 and a cleaning fluid drainer 220 are configured differently. The cleaning fluid supplier 210 and the cleaning fluid drainer 220 are integrated into the substrate table 110 such that the cleaning fluid is introduced and removed through the substrate table 110. The cleaning fluid supplier 210 or the drainer 220 can be configured being through the substrate table and reaching out at a position outside of wafer region. A heater such as the heater 170 may also be included and configured next to the cleaning fluid supplier 210 for heating the cleaning fluid.

Figure 3:
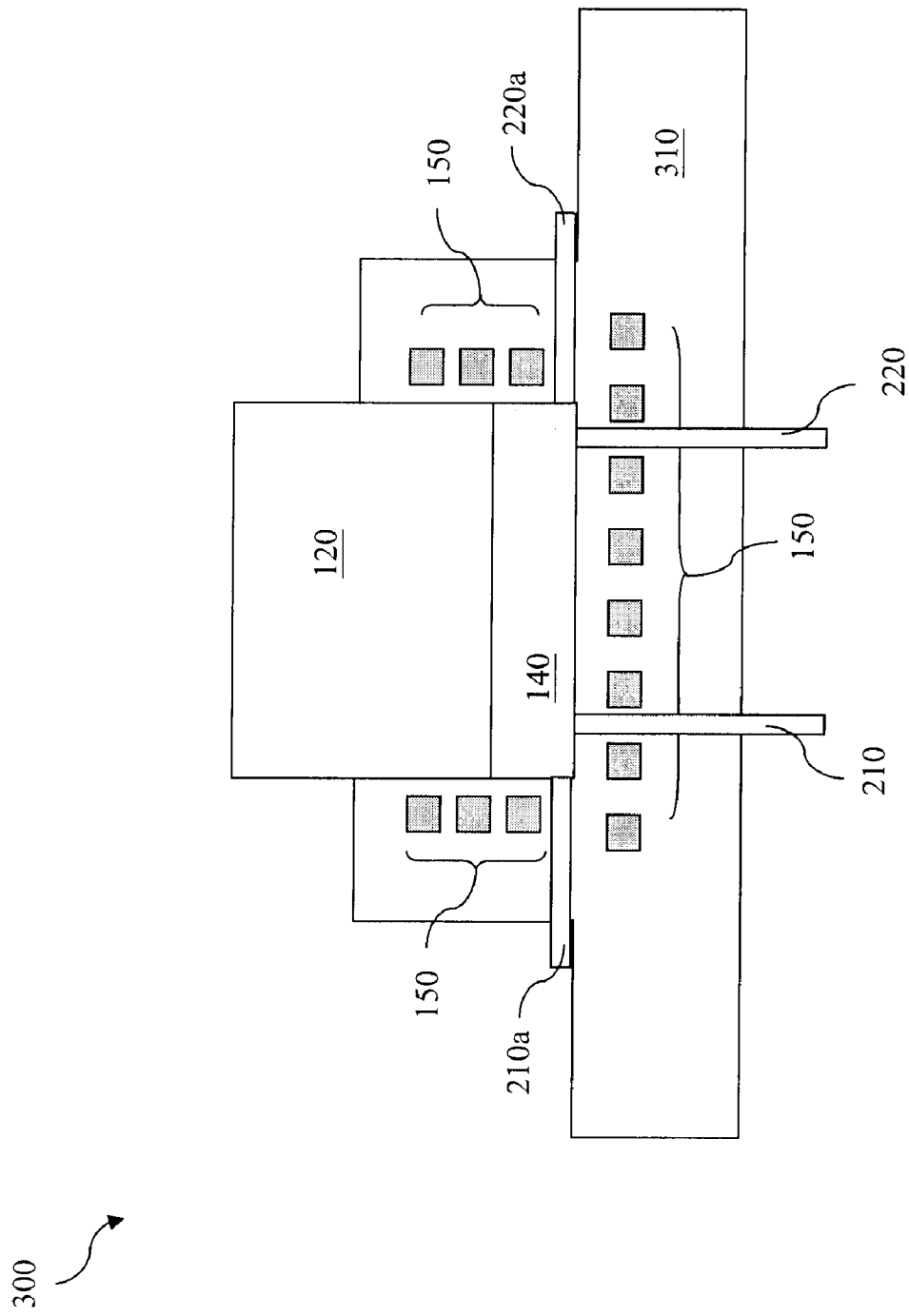

FIG. 3 illustrates a schematic view of another embodiment of a lithography system 300 having a cleaning module. The lithography system 300 may be substantially similar to the system 100 of FIG. 1 or the system 200 of FIG. 2. However, the system 300 has a separate cleaning module 310 incorporated therewith. The cleaning module 310 is designed to be moveable to reach various locations. The cleaning module 310 may include or be integrated with a robot to realize various movements. For example, the cleaning module 310 is operable to move to an idle location without interference with the exposure beam during an exposure process. The cleaning module 310 is operable to move to a cleaning location close to the lens system 120 or the immersion fluid retaining module 130 and retain the cleaning fluid to a surface of the lens system 120 or the immersion fluid retaining module 130 to be cleaned. The cleaning module 310 also includes the ultrasonic units 150, the cleaning fluid supplier 210 or 210a, and the cleaning fluid drainer 220 or 220a integrated therein. The cleaning fluid supplier 210 and the cleaning fluid drainer 220 may be embedded into a bottom portion of the cleaning module 310 such that the cleaning fluid is introduced removed through the substrate table 110. The system 300 may also include a heater similar to the heater 170 of FIG. 1 next to the cleaning fluid supplier 210 for heating the cleaning fluid. The ultrasonic units 150 are configured to provide ultrasonic energy effective for cleaning. For example, the ultrasonic units 150 may be secured in the cleaning module 310 and positioned proximate or adjacent to the cleaning fluid filled therein such that the ultrasonic power is substantially transported to the cleaning fluid. The cleaning module 310 may also include other apertures such as an aperture to provide a purge gas or heating gas to dry the cleaned surfaces. Particularly, the cleaning module 310 may be integrated into a dry lithography system for lens cleaning or other proper cleaning function.

Figure 4A:
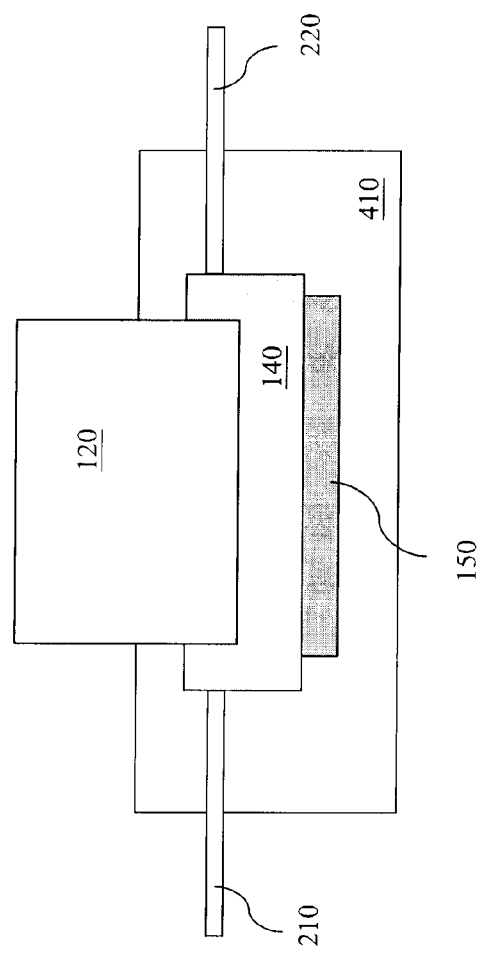
Figure 4B:
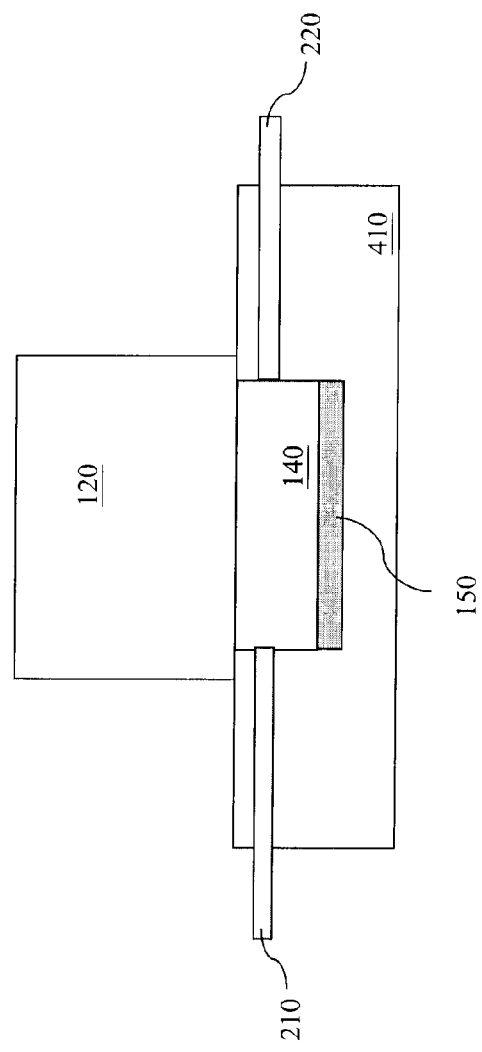

FIGS. 4a and 4b illustrate schematic views of other embodiments of a lithography system 400 having a cleaning module. The lithography system 400 may be substantially similar to the system 300 of FIG. 3. However, the system 400 includes a separate cleaning module 410 configured differently. The cleaning module 410 is designed to be operable to move to various locations. The cleaning module 410 also includes the ultrasonic units 150, the cleaning fluid supplier 210, and the cleaning fluid drainer 220 integrated therein. The cleaning fluid supplier 210 and the cleaning fluid drainer 220 are integrated into lateral portions of the cleaning module 410 and the ultrasonic units 150 are configured in a bottom portion of the cleaning module 410. The cleaning module 410 may also include a top portion to enclose the space filled with the cleaning fluid. Particularly, the cleaning module 410 may be integrated into a dry lithography system for lens cleaning or other proper cleaning function. The cleaning module 410 may also be operable to perform a purging process using the same cleaning fluid supplier 210 and the cleaning fluid drain 220 or alternatively using an additional purging gas supplier and drainer.

Figure 5:
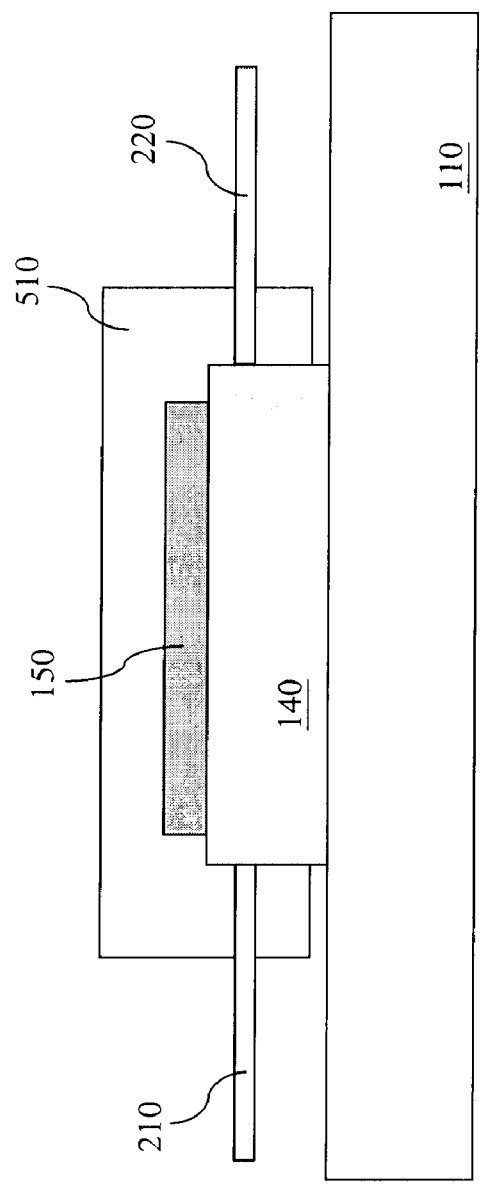

FIG. 5 illustrates a schematic view of another embodiment of a lithography system 500 having a cleaning module. The lithography system 500 may be substantially similar to the system 300 of FIG. 3 or the system 400 of FIGS. 4a and 4b. The system 500 includes a separate cleaning module 510 designed differently for cleaning the substrate table 100 or other components. The cleaning module 510 is operable to move to various locations including an idle location and a cleaning position. For example, the cleaning module 510 is operable to move to a location proximate the substrate table 110 and retain the cleaning fluid to surfaces of the substrate table 110 to be cleaned. The cleaning module 510 also includes the ultrasonic units 150, the cleaning fluid supplier 210, and the cleaning fluid drainer 220 integrated therein. The cleaning fluid supplier 210 and the cleaning fluid drainer 220 are configured in lateral portions of the cleaning module 510 and the ultrasonic units 150 are configured in a top portion of the cleaning module 510. A heater similar to the heater 170 of FIG. 1 may also be included and properly configured for heating the cleaning fluid. The cleaning module 510 may also include a vacuum aperture to draw fluid resides and/or a purge aperture to provide a purge gas for drying.

Figure 6:
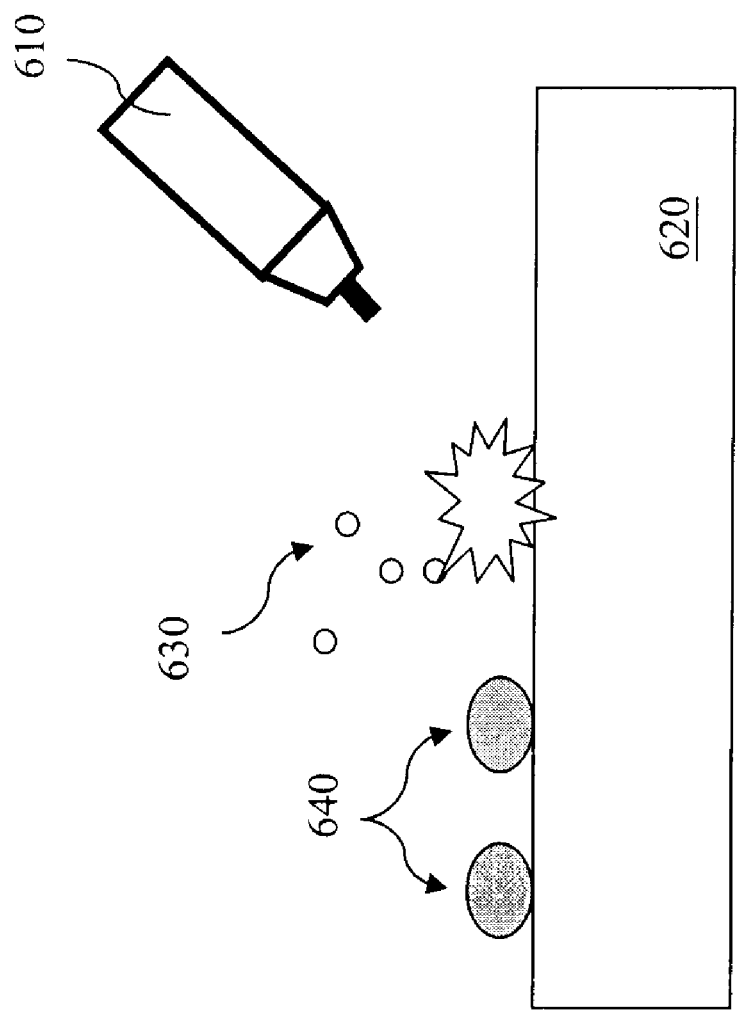
FIGS. 6 through 9 illustrate schematic views of various embodiments of a cleaning unit incorporated in a cleaning module.

FIG. 6 illustrates a schematic view of an embodiment of a jet 610 that can be incorporated in a lithography system or other semiconductor fabrication systems for performing a non contact cleaning process to various surfaces of the system. The jet 610 is designed to be connected to a fluid source to provide a cleaning fluid. The jet 610 may have a jet pressure higher than an atmospheric pressure to project the cleaning fluid to a component 620 to be cleaned. The jet is operable to be tilted at various angles and move in various configurations. Particularly, the jet 610 is designed to provide a special cleaning fluid, referred to as a liquid gas. The liquid gas is initially in a liquid state and is projected to the component 620 by the jet 610. When the liquid gas contacts the targeted surface, it turns into gas 630 and blows out. Such a blowout transition from liquid to gas can be utilized to clean the component 620, removing particles 640 adhered thereon. The component 620 to be cleaned may include a lens, a substrate table, an immersion fluid retaining module, and other parts of a lithography system. The component 620 may be extended to include various features of other semiconductor fabrication apparatus. The various components may include an internal wall of a processing chamber or a wafer robot. The liquid 630 may include liquid nitrogen, liquid argon, or other suitable liquid gases initially provided at their liquid states having a liquid-gas transition temperature lower than the temperature of the component 620 during the cleaning. The jet 610 can further combine with a vacuum component configure to draw the cleaning gas.

Figure 7:
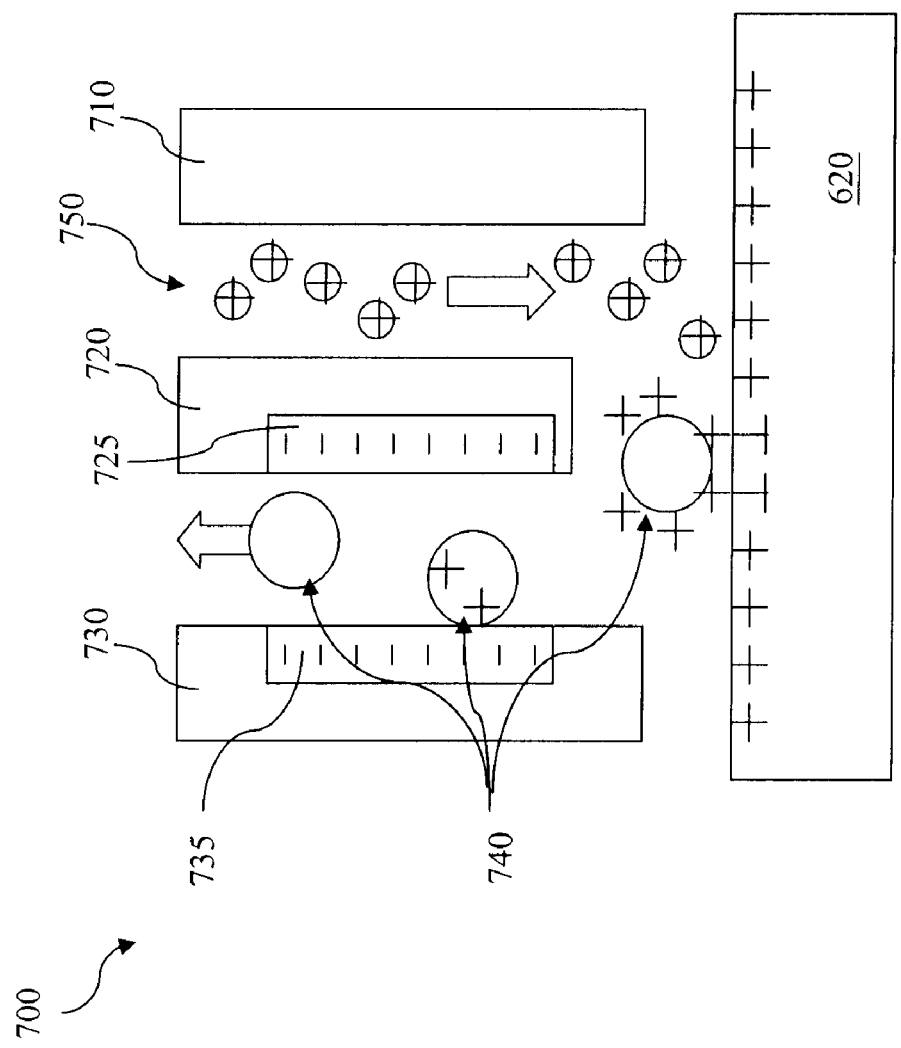

FIG. 7 illustrates a schematic view of an embodiment of an electrostatic cleaning module 700 that can be incorporated in a lithography system or other semiconductor fabrication systems for performing a non-contact cleaning process to various surfaces of the system. The electrostatic cleaning module 700 is designed to remove particles or other contaminations from the component 620 using electrostatic interaction. As an exemplary configuration illustrated in FIG. 7, the electrostatic cleaning module 700 includes various plates (or other proper features) 710, 720, and 730. The plates 720 and 730 may further include conductive plates 725 and 735, respectively. The plates are configured to form an entrant path between the plate 710 and 720, and form an exit path between the plate 720 and 730. The setup described above can be positioned next to the component 620 to be cleaned as illustrated. A high positive voltage may be applied to the component 620 and particles 740 adhered on the component 620 may also be charged. A high negative voltage may be applied to the conductive plates 725 and 735. A charged gas 750 such as charged argon gas is introduced and passes through the entrance path between the pates 710 and 720. When passing by the surface of the component 620, the charged gas 750 may drive away or carry away the particles 750 from the component 620 and move to the exit path between the plates 720 and 730. When passing the negatively charged plates 725 and 735, the charged particles 740 have an electrostatic interaction with the charged plates 725 and 735. The charged particles 740 may be neutralized by the charged plates or be attracted to the conductive plates 725 and 735. The electrostatic cleaning module 700 may be designed otherwise differently for effective cleaning and optimized performance. For example, the component 620 and the conductive plates 725 and 735 may have high voltages applied reversely. The charged gas 750 may be generated to have negative charge or positive charge according to various configurations.

The charged gas 750 may be provided by a charge gas jet, an ion shower, or other charge generators, or generated by the plates 710 and 720. The ion generator may directly deliver ions to the component 620 to remove electrostatic discharge (ESD) induced particles.

Figure 8:
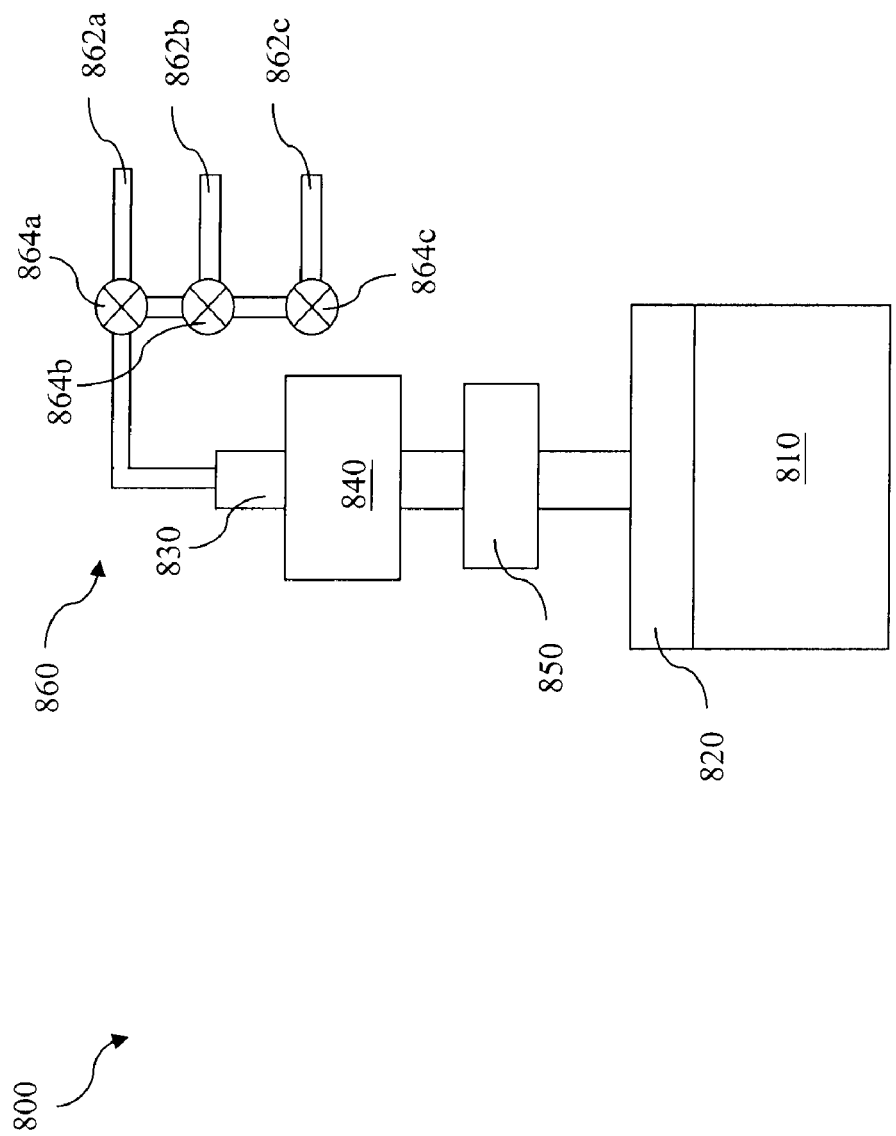

FIG. 8 illustrates a schematic view of an embodiment of a cleaning scrubber 800 that can be incorporated in a lithography system or other semiconductor fabrication systems for performing a cleaning process to various components of the system. For example, the cleaning scrubber 800 may be incorporated into an immersion lithography system. The cleaning scrubber 800 includes a cleaning head 810. The cleaning head 810 may be designed as a sponge, a fiber-like brush, or other suitable structures. The cleaning head 810 may include a material selected from the group consisting of polyethylene (PE), polyvinyl alcohol (PVA), and polypropylene (PP). The cleaning head 810 may further include a transportation path for delivering the cleaning fluid.

The cleaning scrubber 800 may include a holder 820 designed to hold the cleaning head 810. The cleaning scrubber 800 may further include a connector 830 to secure the holder 820, provide a fluid path coupled to the delivery path of the cleaning head 810, and provide a structure to hold other components. A motor 840 is included and may be integrated with the connector 830 to drive the cleaning head to move in various modes including rotation around its axis (along the direction of the connector 830), vibration along the axis, transitional vibration (or movement) perpendicular to its axis, or combination thereof. The rotation speed may range between about 1 rpm and 1000 rpm. The motor may also remain static without rotation. The vibration along the axis may have a frequency ranging between about 0.5 Hz and 5000 Hz. The transitional vibration may have a frequency ranging between about 0.5 Hz and 5000 Hz. The cleaning scrubber 800 may further include an ultrasonic unit 850 integrated to introduce ultrasonic power to the cleaning fluid. The ultrasonic unit 850 may be similar to one of the ultrasonic units 150 of FIG. 1.

The cleaning scrubber 800 includes a cleaning fluid supplier 860 to provide various cleaning fluids. For example, the cleaning fluid supplier 860 may be designed to include multiple inlets 862a, 862b, and 862c and multiple valves 864a, 864b, and 864c associated with the inlets, respectively, to provide various fluids and control flow on/off and flow rate thereof. Thus various fluids may be mixed at certain ratios or only one fluid is flowed during a time and another fluid is flowed during another time to implement various cleaning recipes. In one embodiment, the inlet 862a may be connected to a DIW source to provide DIW. The inlet 862b may be connected to a first chemical source to provide the first chemical. The inlet 862c may be connected to a second chemical source to provide the second chemical. The various fluids may include, but are not limited to, surfactant, solvent, $NH_4OH$, $H_2O_2$, $O_3$, PGME/PGMEA (propylene glycol monomethyl ether/Propylene glycol monomethyl ether acetate), cyclohexanol, Isopropyl alcohol (IPA), acetone, alcohol, monoethanolamine (MEA), and combinations thereof. The cleaning fluid supplier 860 may include one or more heater similar to the heater 170 of FIG. 1 and configured for heating the associated fluids.

Figure 9:
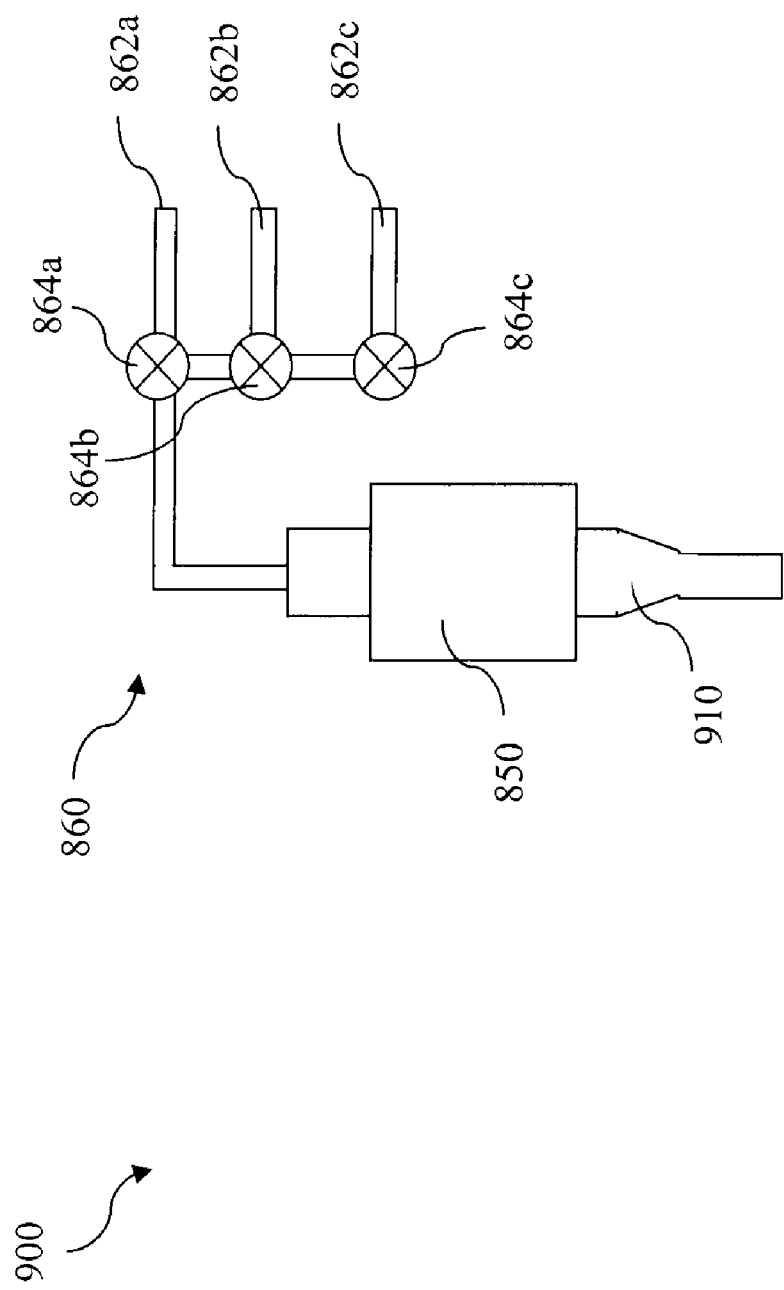

FIG. 9 illustrates a schematic view of another embodiment of a cleaning jet 900 that can be incorporated in a lithography system or other semiconductor fabrication systems for performing a cleaning process to various surfaces of the system. For example, the cleaning jet 900 may be incorporated into an immersion lithography system. The cleaning jet 900 may be integrated to the immersion lithography system and positioned on the substrate table. The cleaning jet 900 includes an jet head similar to the jet 610 of FIG. 6 but may be designed differently for performing different cleaning recipes and using different cleaning fluids. The jet pressure may be designed higher than one atmospheric pressure. The cleaning jet 900 may be designed to project a cleaning fluid having a flow rate ranging between about 0.1 cc/sec and 200 cc/sec.

The cleaning jet 900 may include an ultrasonic unit 850 integrated therewith to introduce ultrasonic energy to the cleaning fluid. The cleaning jet 900 may further include a fluid purge dry nozzle around thereof. The cleaning jet 900 includes a cleaning fluid supplier 860 to provide various cleaning fluids. For example, the cleaning fluid supplier 860 may be designed to include multiple inlets 862a, 862b, and 862c and multiple valves 864a, 864b, and 864c associated, respectively, to provide various fluids and control flow on/off and flow rate thereof, for implementing various cleaning recipes. The cleaning fluid supplier 860 may include one or more heater similar to the heater 170 of FIG. 1 and configured for heating the associated fluids. The cleaning jet 900 may include a motor designed such that the jet is moveable in various mode and can be tilt at any expected angle.

Figure 10:
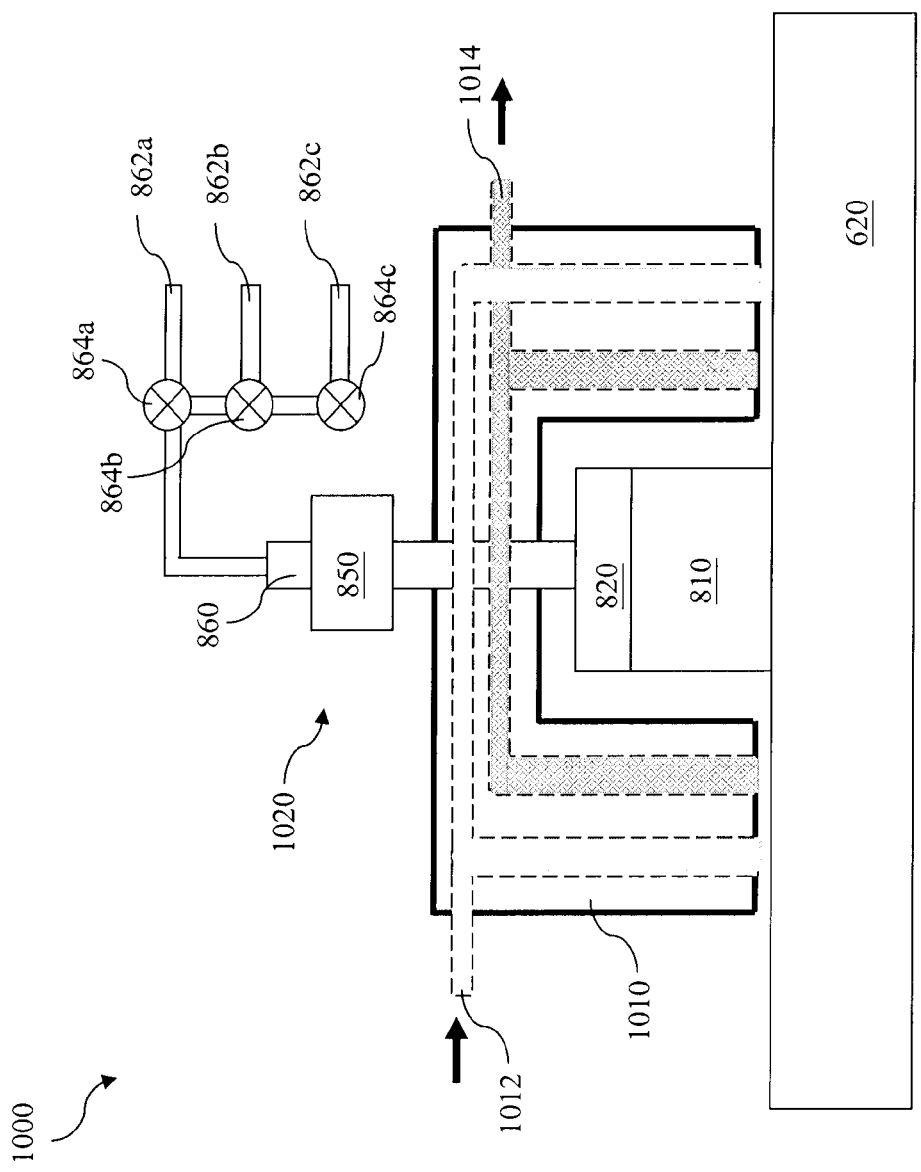
FIGS. 10 through 11 illustrate schematic views of various embodiments of an immersion lithography system having a cleaning module.

FIG. 10 illustrates a schematic view of another embodiment of a cleaning module 1000 having one of the cleaning units of FIGS. 6 though 9, integrated therewith. The cleaning module 1000 can be incorporated in a lithography system or other semiconductor fabrication systems for performing a cleaning process to various portions of the system such as the component 620. In one embodiment, the cleaning module 1000 may be incorporated into an immersion lithography system.

The cleaning module 1000 includes a cleaning frame 1010 designed to enclose a space for cleaning, provide a cleaning solution, drain the used cleaning solution, hold a cleaning unit, and perform other functions such as providing a purging gas. The cleaning frame 1010 may include a purge gas delivery system 1012 integrated therein to deliver a purge gas for cleaning and/or drying. The purge gas delivery system 1012 may provide the purge gas a pressure higher than the process working pressure. The purge gas may include nitrogen, argon, compressed dry air, and other suitable gases. The purge gas delivery system 1012 may have one or more opening for delivering the purge gas. The purge gas may be connected with heating element to further supply heating air for drying. The cleaning frame 1010 may include a vacuum drain system 1014 to remove the cleaning fluid, the purge gas, and/or other waste fluids or residues. The vacuum drain system 1014 may have a pressure low than the process working pressure such that the waste fluid and/or purge gas can be drawn away by a negative pressure difference. The vacuum drain system 1014 may have one or more opening configured for optimized draining effect.

The cleaning module 1000 includes a cleaning unit 1020 integrated therewith. The cleaning unit 1020 may be the cleaning scrubber 800 of FIG. 8, the cleaning jet 900 of FIG. 9, combinations thereof, or other suitable cleaning units. The illustrated cleaning unit 1020, as an example, is a cleaning scrubber similar to the cleaning scrubber 800 of FIG. 8 in terms of configuration, operation, and application.

Figure 11:
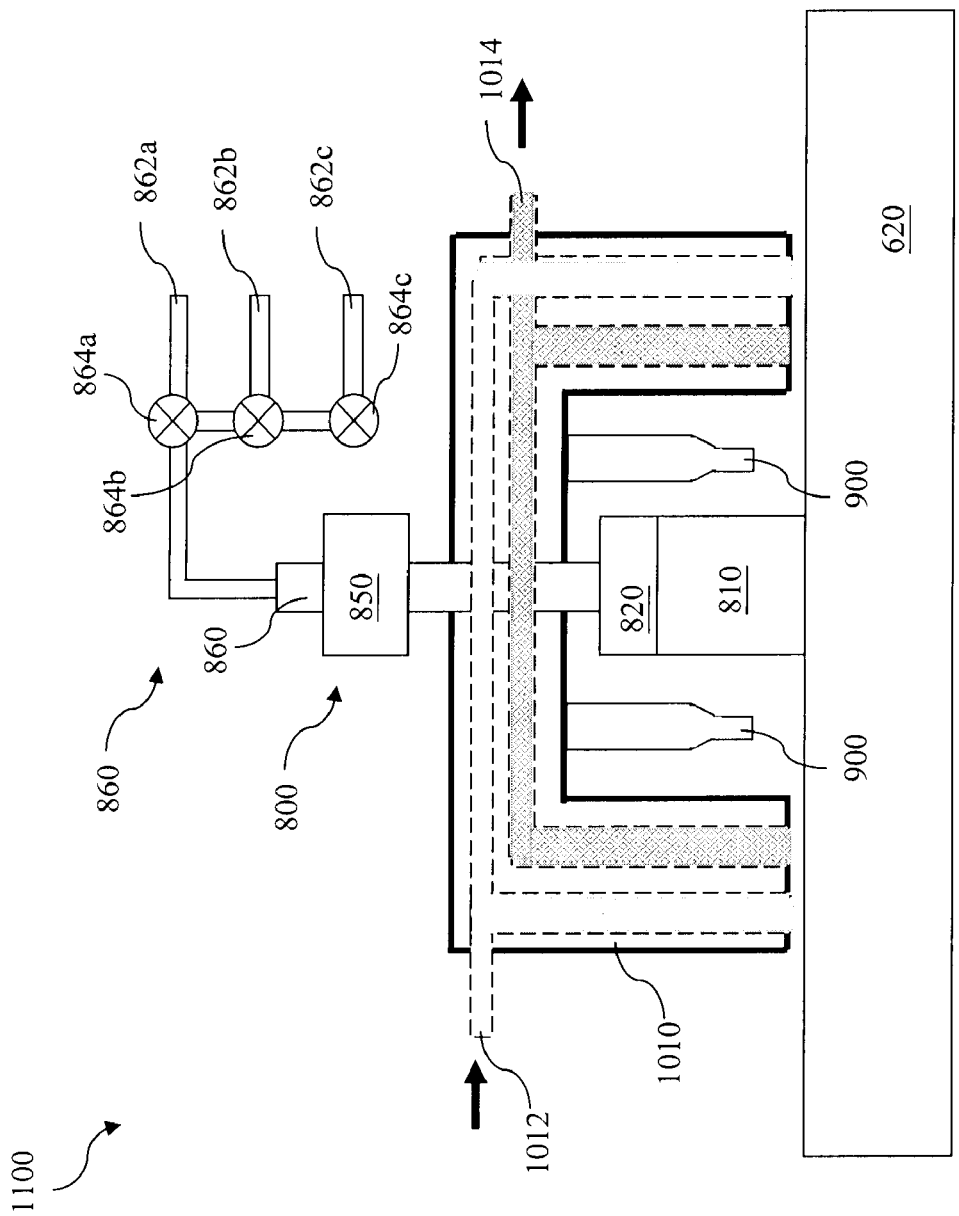

In another example, cleaning scrubber 800 and jet 900 may be combined in various configuration and integrated with the cleaning frame 1010 such as an exemplary cleaning module 1100 illustrated as a schematic view in FIG. 11. The cleaning module 1100 includes the cleaning scrubber 800 and two jets 900 positioned on two sides of the cleaning scrubber. The various cleaning units 800 and 900 may be combined to share one common cleaning fluid supplier 860. The common cleaning fluid supplier 860 may further have a heater incorporated therewith for heating the cleaning fluids.

Figure 13C:
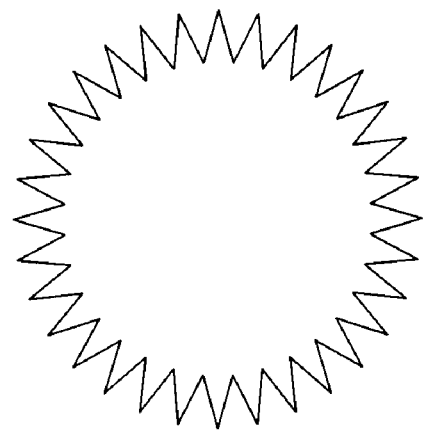
FIGS. 13a through 13c illustrate schematic views of various embodiments of cleaning an immersion lithography system utilizing one of the cleaning modules of FIG. 1 through FIG. 11 in various motion modes.
Figure 13B:
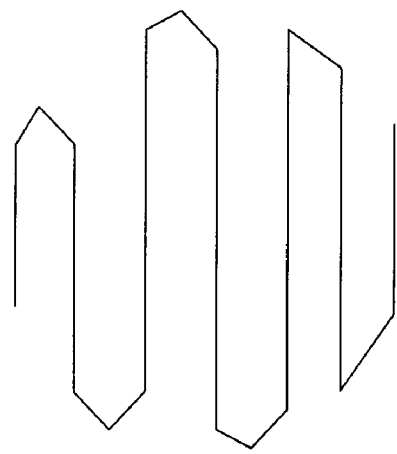
Figure 13A:
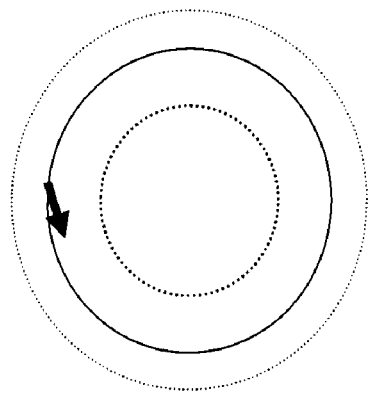

Referring to FIGS. 12a and 12c, a cleaning module 1210 is similar to one or more of the cleaning modules 1000 of FIG. 10 or 1100 of FIG. 11. The cleaning module may be integrated with a lithography system, particularly an immersion lithography system, a semiconductor wafer fabrication apparatus to clean various components of the associated systems. For example, the cleaning module 1210 may be utilized to clean an immersion fluid retaining module 130 as illustrated in FIG. 12a, a lens system 120 as illustrated in FIG. 12b, and/or a substrate table 110 wherein a wafer 1220 may be positioned. The cleaning module 1210 may be designed to be operable to move in various patterns. For examples, the cleaning module 1210 may move in various patterns illustrated in FIGS. 13a, 13b, and 13c.

Figure 14B:
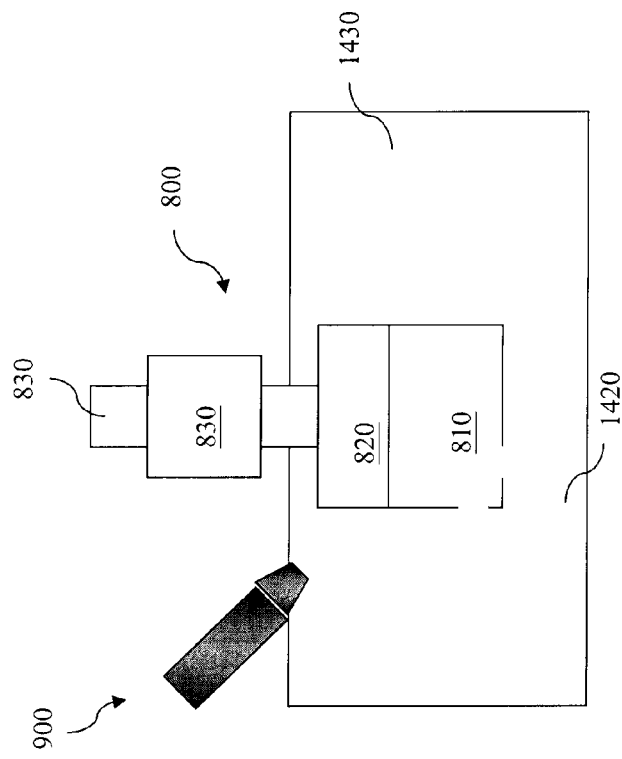
FIGS. 14a through 14b illustrate schematic views of various embodiments of a system for cleaning the cleaning module of FIG. 8.
Figure 14A:
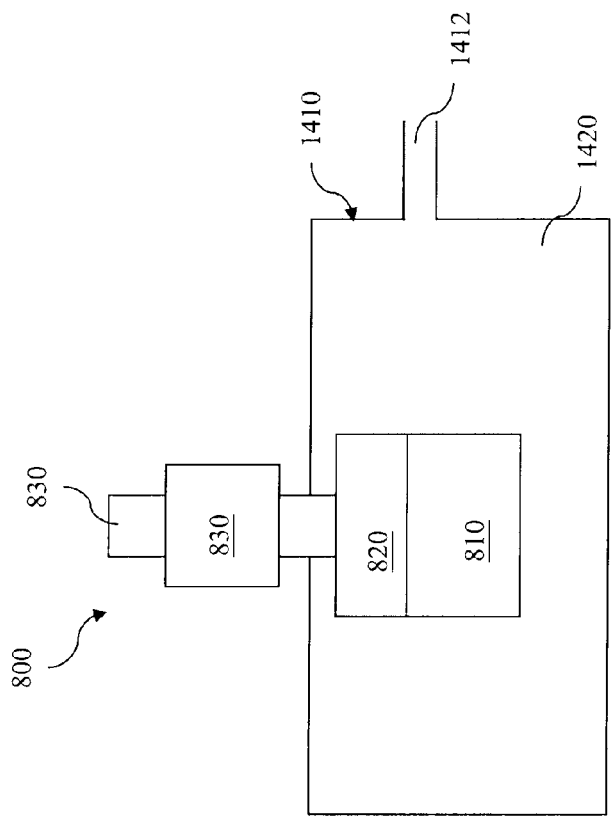

FIGS. 14a and 14b illustrate schematic views of various embodiments of a self cleaning system and method for cleaning the cleaning scrubber 800 of FIG. 8 or other suitable cleaning units. The self cleaning system illustrated in FIG. 14a includes a cleaning tank 1410 with a cleaning solution 1420 filled therein. The cleaning tank 1410 may include other features such as a chemical inlet 1412 to provide the cleaning solution 1420 and may further include an ultrasonic unit built in to substantially agitate the cleaning solution for efficient cleaning effect. The cleaning tank 1410 may additionally include a heater built in the tank. The cleaning head 810 of the cleaning scrubber 800 may be completely soaked in the cleaning solution 1420 for cleaning. The cleaning solution 1420 may include SC1, SC2, Piranha, $H_2O_2$, or ozone water, $NH_4OH/H_2O_2/H_2O$, or other proper chemical solutions.

The setup illustrated in FIG. 14b includes a cleaning tank 1430 and a jet 900 configured to project a cleaning solution to the cleaning scrubber 800 for cleaning. The two self cleaning systems may be used alternatively or collectively for cleaning and maintaining the cleaning scrubber incorporated in various cleaning modules and further incorporated in various semiconductor fabrication apparatus. The first or second self cleaning system may be included as part of the cleaning scrubber 800.

Various embodiments of a cleaning unit or a cleaning module described through FIG. 1 through 11 only serve as examples for a semiconductor fabrication apparatus having a cleaning unit or a cleaning module integrated therewith. These examples are not intended to be limiting. Various combinations and/or modifications may be applied in different applications and fabrication systems.

Figure 15:
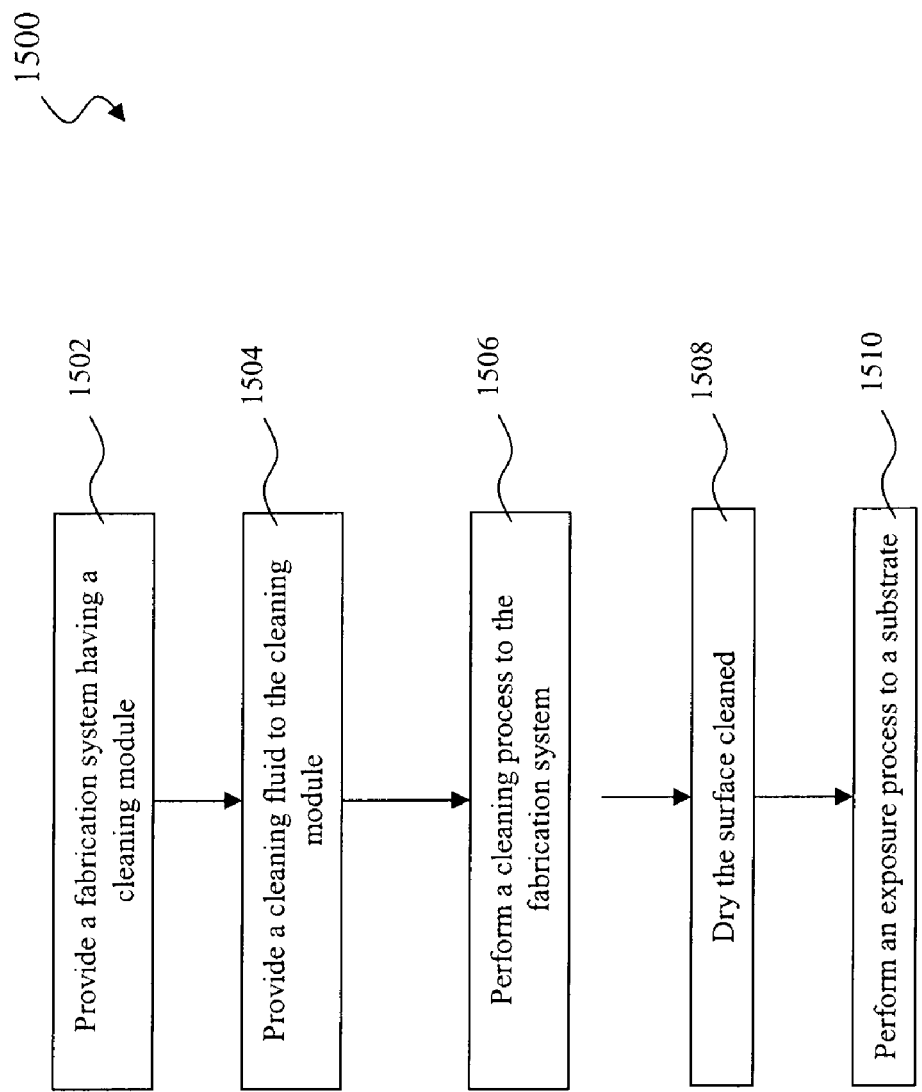
FIG. 15 is a flowchart of one embodiment of a method for cleaning an immersion photolithography system having a cleaning module.

FIG. 15 provides a flowchart of one exemplary method 1500 for cleaning a semiconductor fabrication apparatus using an integrated cleaning module. The method 1500 may begin at step 1502 by providing a semiconductor fabrication apparatus having a cleaning module integrated. The semiconductor fabrication apparatus may be an immersion lithography system, or alternatively a dry lithography system, or a semiconductor fabrication apparatus such as a physical vapor deposition (sputtering) system, or a chemical vapor deposition system. The cleaning module may include ultrasonic units configured in various embodiments illustrated in FIGS. 1 through 5. The cleaning module may be integral to an immersion fluid retaining module or may be a separate module. The cleaning module may include other cleaning units such as those illustrated in FIGS. 6 through 9, including a cleaning scrubber, an jet, an jet using with liquid gas, an electrostatic cleaner, an ultrasonic unit, or combinations thereof. The cleaning module may be the cleaning module 1000 or 1100 of FIGS. 10 and 11, respectively, for examples.

At step 1504, a cleaning fluid is provided through the cleaning module, the cleaning fluid may include DIW, surfactant, solvent, $NH_4OH$, $H_2O_2$, $O_3$, PGME/PGMEA (propylene glycol monomethyl ether/Propylene glycol monomethyl ether acetate), cyclohexanol, Isopropyl alcohol (IPA), acetone, alcohol, monoethanolamine (MEA) or combinations thereof. The cleaning fluid may have a temperature ranging between about 20° C. and 70° C. An exemplary cleaning fluid may include $H_2O_2$, or ozone water. Another exemplary cleaning fluid may include $NH_4OH/H_2O_2/H_2O$.

At step 1506, the method 1500 performs a cleaning process to clean components of the semiconductor cleaning apparatus such as to clean a lens, a substrate table, and/or an immersion fluid retaining module in an immersion lithography system. Other exemplary components to be cleaned may include a wafer robot or walls of a processing chamber. During the cleaning process, the cleaning module may move in various patterns. Various features or functions of the cleaning module may be synchronically turned on and work together. For example, ultrasonic energy and/or heating energy may be introduced into the cleaning solution according to various cleaning recipes for different cleaning applications. Steps 1504 and 1506 may be combined to perform the cleaning process. The cleaning process may have a duration ranging between about 0.5 second and 30 minutes. The method 1500 may perform a DIW rinsing process after a cleaning process.

The method 1500 proceeds to step 1508 to perform a drying process to the surfaces (or the components) cleaned at the previous steps. The drying process 1508 may include delivering a purge gas through the cleaning module. The purge gas may include argon, nitrogen, or other suitable gas. The drying process may alternatively or collectively be implemented using other liquids such as IPA. The drying process may also using vacuum component configure to draw the cleaning fluid.

At step 1510, after the cleaning is completed, a substrate such as a semiconductor wafer may be loaded and positioned on a substrate table for normal semiconductor processing such as an immersion lithography exposure, a dry lithography exposure, a thin film deposition, or other processes operable in the associated system. The cleaning process from step 1504 to step 1508 may be implemented at a predefined schedule for tool maintenance, or after a certain number of wafers have been processed through, or when other inspection data, test data, and/or qualification data show certain degradation.

Thus, the present disclosure provides a lithography apparatus. The apparatus includes an imaging lens module; a substrate table positioned underlying the imaging lens module and configured to hold a substrate; and a cleaning module adapted to clean the lithography apparatus, wherein the cleaning module is selected from the group consisting of an ultrasonic unit, a scrubber, a fluid jet, an electrostatic cleaner, and combinations thereof.

The apparatus may further include an immersion fluid retaining module configured to provide an immersion fluid to a space between the imaging lens module and a substrate on the substrate table. The cleaning module may be operable to clean at least one of the imaging lens, the substrate table, and/or the immersion fluid retaining module. The cleaning module may be integrated with at least one of the immersion fluid retaining module and the substrate table. The cleaning module may be integrated with a robot. The cleaning module may be configured to move in a mode selected from the group consisting of rotation, vibration, horizontal movement, and combinations thereof. The cleaning module may include a cleaning fluid inlet to provide a cleaning fluid for use with the cleaning module. The cleaning fluid may be selected from the group consisting of an immersion fluid, a chemical solution, and a purge gas. The cleaning fluid may include a material selected from the group consisting of surfactant, solvent, $NH_4OH$, $H_2O_2$, $O_3$, PGME/PGMEA, cyclohexanol, Isopropyl alcohol (IPA), acetone, alcohol, and MEA. The cleaning module may include a vacuum component configured to draw the cleaning fluid. The ultrasonic unit may be adapted to provide an ultrasonic energy to a cleaning fluid. The scrubber may be selected from a sponge and a brush. The scrubber may include a material selected from the group consisting of Polyethylene (PE), Polyvinyl Alcohol (PVA), and Polypropylene (PP). The fluid jet may be operable at various pressures, angles, and movements. The fluid jet may be configured to use a liquid gas for cleaning.

The present disclosure also provides an immersion lithography apparatus. The apparatus include an imaging lens module; a substrate table configured to secure a substrate and positioned underlying the imaging lens; a fluid module configured to provide a fluid to a space between the imaging lens module and a substrate on the stage; and an ultrasonic module configured to provide ultrasonic energy to clean the immersion lithography apparatus.

In the apparatus, the ultrasonic module may be embedded in the stage and/or the fluid module. The ultrasonic module may be operable to move for optimized cleaning. The ultrasonic module may include multiple ultrasonic units. The ultrasonic module may be operable to provide an ultrasonic energy with a power ranging between about 1 milliwatt to 1 kilowatt and a frequency ranging between about 1 KHz and 1 GHz. The ultrasonic module may be adapted to provide ultrasonic energy to a cleaning fluid. The fluid module may be configured to provide a fluid selected from the group consisting of de-ionized water, cleaning chemicals, nitrogen gas, argon gas, and combinations thereof. The fluid module may be configured to provide a liquid gas that turns to gas upon in contact with a solid surface. The liquid gas may be selected from the group consisting of nitrogen and argon. The fluid module may be configured to provide the liquid gas at a temperature below 0° C.

The present disclosure also provides a method. The method includes providing a lithography apparatus having a cleaning module, wherein the cleaning module includes at least one of a scrubber, a fluid jet, an ultrasonic unit, and an electrostatic cleaner; performing a cleaning process to the lithography apparatus by utilizing the cleaning module; and performing an exposure process to a substrate coated with an imaging layer. The performing of the cleaning process may include utilizing a cleaning fluid selected from the group consisting of an immersion fluid, a chemical solution, a liquid gas, and a purge gas. The performing of the cleaning process may include utilizing a cleaning fluid having a material selected from the group consisting of surfactant, solvent, NH4OH, H2O2, O3, PGME/PGMEA cyclohexanol, Isopropyl alcohol (IPA), acetone, alcohol, and MEA. The performing of the cleaning process may include cleaning at least one of an imaging lens, a substrate table, and a fluid module of the lithography apparatus. The performing of the cleaning process may include a drying procedure. The method may further include dispensing an immersion fluid between a space between an imaging lens and the substrate before the performing of the exposure process. The performing of the exposure process may include exposing a semiconductor wafer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An immersion lithography apparatus, comprising:
   an imaging lens module;
   a substrate table positioned underlying the imaging lens module and configured to hold a substrate;
   an immersion fluid retaining module; and
   a cleaning module adapted to clean the imaging lens module, substrate table, and immersion fluid retaining module, wherein the cleaning module includes an ultrasonic unit, wherein the cleaning module is a distinct module separate from the substrate table and the immersion fluid retaining module, and wherein the cleaning module is integrated with a robot.

2. The apparatus of claim 1, wherein the cleaning module is integrated with the robot such that the cleaning module is operable to move to an idle location and a cleaning location, wherein the idle location and the cleaning location are different.

3. The apparatus of claim 1, wherein the cleaning module is configured to move in a mode selected from the group consisting of rotation, vibration, horizontal movement, and combinations thereof.

4. The apparatus of claim 1, wherein the cleaning module further comprises a cleaning fluid inlet to provide a cleaning fluid for use with the cleaning module and a heater for heating the cleaning fluid to a higher temperature.

5. The apparatus of claim 4, wherein the cleaning fluid is selected from the group consisting of an immersion fluid, a chemical solution, and a purge gas.

6. The apparatus of claim 4, wherein the cleaning fluid comprises a material selected from the group consisting of surfactant, solvent, $NH_4OH$, $H_2O_2$, $O_3$, NMP, PGME/PGMEA cyclohexanol, IPA, acetone, alcohol, MEA, and HA.

7. The apparatus of claim 4, wherein the cleaning module comprises a vacuum component configured to draw the cleaning fluid.

8. The apparatus of claim 1, wherein the cleaning module further comprises a scrubber, the scrubber selected from a sponge and a brush.

9. The apparatus of claim 1, wherein the cleaning module further comprises a scrubber, the scrubber comprising a material selected from the group consisting of Polyethylene (PE), Polyvinyl Alcohol (PVA), and Polypropylene (PP).

10. The apparatus of claim 1, wherein the cleaning module further comprises a fluid jet, the fluid jet operable at various pressures, angles, and movements.

11. The apparatus of claim 10, wherein the fluid jet is configured to use a liquid gas for cleaning.

12. An immersion lithography apparatus, comprising:
    an imaging lens module;
    a substrate table configured to secure a substrate and positioned under the imaging lens;
    a fluid module configured to provide a fluid to a space between the imaging lens module and a substrate on the stage; and
    an ultrasonic unit configured to clean the immersion lithography apparatus, wherein the ultrasonic unit is configured to move to various locations in the apparatus independently of the substrate table.

13. The apparatus of claim 12, wherein the ultrasonic unit operates in conjunction with a scrubber.

14. The apparatus of claim 12, wherein the ultrasonic unit operates in conjunction an electrostatic cleaner.

15. The apparatus of claim 12, wherein a fluid jet operates in conjunction with the ultrasonic unit and a scrubber.

16. A method, comprising:
providing a lithography apparatus having a cleaning module, wherein the cleaning module includes an ultrasonic unit, and wherein the lithography apparatus includes imaging a lens module, a substrate table, and an immersion fluid retaining module, and wherein the cleaning module is operable to move independently of each of the lens module, the substrate table, and the immersion fluid retaining module;
moving the cleaning module to a first position;
performing a cleaning process to the imaging lens module, substrate table, and immersion fluid retaining module by utilizing the cleaning module, while the cleaning module is at the first position;
moving the cleaning module to a second position; and
performing an exposure process to a substrate coated with an imaging layer, while the cleaning module is at the second position.

17. The method of claim 16, wherein the performing of the exposure process comprises exposing a semiconductor wafer.

18. The method of claim 16, wherein the performing of the cleaning process includes drying the substrate.

19. The method of claim 16, further comprising:
moving the cleaning module to a third position, after the first position and prior to the second position, wherein the third position is proximate to the lens module, and wherein the cleaning process is performed at the third position.

20. The method of claim 19, further comprising:
moving the cleaning module to a fourth position, after the third position and prior to the second position, wherein the third position is proximate to the immersion fluid retaining module, wherein the first, second, third, and fourth position are different, and wherein the cleaning process is performed at the fourth position.

* * * * *